United States Patent [19]

Bobbio

[11] Patent Number: 5,045,166
[45] Date of Patent: Sep. 3, 1991

[54] MAGNETRON METHOD AND APPARATUS FOR PRODUCING HIGH DENSITY IONIC GAS DISCHARGE

[75] Inventor: Stephen M. Bobbio, Wake Forest, N.C.

[73] Assignee: MCNC, Research Triangle Park, N.C.

[21] Appl. No.: 526,572

[22] Filed: May 21, 1990

[51] Int. Cl.$^5$ .................. B01J 19/12; H01H 1/46; C23F 4/04; C23C 14/35
[52] U.S. Cl. .................. 204/192.32; 204/192.12; 204/298.06; 204/298.16; 204/298.37; 204/298.38; 118/723; 156/345; 156/643
[58] Field of Search .................. 204/192.12, 192.32, 204/298.06, 298.16, 298.37, 298.38; 156/345, 643; 118/723

[56] References Cited

U.S. PATENT DOCUMENTS

| | | | |
|---|---|---|---|
| 3,627,663 | 12/1971 | Davidse et al. | 204/192.15 |
| 3,654,123 | 4/1972 | Hajzak | 204/298.06 |
| 3,860,507 | 1/1975 | Vossen, Jr. | 204/192.12 |
| 4,155,825 | 5/1979 | Fournier | 204/192.13 |
| 4,175,029 | 11/1979 | Kovalsky et al. | 204/298.06 |
| 4,198,283 | 4/1980 | Class et al. | 204/298.12 |
| 4,252,626 | 2/1981 | Wright et al. | 204/192.15 |
| 4,277,304 | 7/1981 | Horiike et al. | 156/643 |
| 4,349,409 | 9/1982 | Shibayama et al. | 156/643 |
| 4,351,714 | 9/1982 | Kuriyama | 204/298.26 |
| 4,352,725 | 10/1982 | Tsukada | 156/643 |
| 4,361,472 | 11/1982 | Morrison, Jr. | 204/192.12 |
| 4,361,749 | 11/1982 | Lord | 219/121.4 |
| 4,362,611 | 12/1982 | Logan et al. | 204/298.06 |
| 4,369,205 | 1/1983 | Winterling et al. | 427/39 |
| 4,392,932 | 7/1983 | Harra | 204/192.32 |
| 4,399,016 | 8/1983 | Tsukada et al. | 156/643 |
| 4,404,077 | 9/1983 | Fournier | 204/192 |
| 4,417,968 | 11/1983 | McKelvey | 204/192.12 |
| 4,422,896 | 12/1983 | Class et al. | 156/643 |
| 4,426,267 | 1/1984 | Münz et al. | 204/192.12 |

(List continued on next page.)

FOREIGN PATENT DOCUMENTS

| | | | |
|---|---|---|---|
| 0027553 | 10/1979 | European Pat. Off. | 204/192.25 |
| 0162643 | 5/1984 | European Pat. Off. | 204/298.19 |
| 0163445 | 5/1984 | European Pat. Off. | 204/298.18 |
| 3434698 | 4/1986 | Fed. Rep. of Germany | 204/298.19 |
| CH657381 | 8/1986 | Switzerland | 204/298.19 |
| 2093866 | 9/1982 | United Kingdom | 204/298.19 |

OTHER PUBLICATIONS

*Thin Film Processes*, Cylindrical Magnetron Sputtering, J. A. Thornton and A. S. Penfold, Academic Press, Inc., 1978, pp. 76–113.

*Silicon Processing for the VLSI Era*, Dry Etching for VLSI Fabrication, S. Wolf and R. N. Tauber, 1986, pp. 538–585.

"MCNC Technical Bulletin", Plasma Etching, S. M. Bobbio and Y. S. Ho, Jul.-Aug., 1986, pp. 2 and 8.

Primary Examiner—Aaron Weisstuch
Attorney, Agent, or Firm—Bell, Seltzer, Park & Gibson, P.A.

[57] ABSTRACT

A method and apparatus for magnetron gas discharge processing of substrates using a remote plasma source provides a uniform magnetic field (B) created across the surface of a substrate in an evacuable chamber. An electric field (E) is created perpendicular to the substrate by an electrically powered cathode located beneath the substrate. The magnetic and electric fields interact with the plasma to create an $E \times B$ electron drift region adjacent to the surface of a substrate. A remote plasma source is provided and oriented so that the plasma stream from the remote source is coupled to the $E \times B$ region adjacent to the substrate surface parallel to the magnetic field with minimal movement of the plasma stream perpendicular to the magnetic field to thereby provide a high density plasma stream into the $E \times B$ drift region.

52 Claims, 6 Drawing Sheets

U.S. PATENT DOCUMENTS

| | | | |
|---|---|---|---|
| 4,427,524 | 1/1984 | Crombeen et al. | 204/298.06 |
| 4,428,816 | 1/1984 | Class et al. | 204/298.18 |
| 4,434,038 | 2/1984 | Morrison, Jr. | 204/192.15 |
| 4,464,223 | 8/1984 | Gorin | 156/643 |
| 4,465,575 | 8/1984 | Love et al. | 204/192.26 |
| 4,472,259 | 9/1984 | Class et al. | 204/298.18 |
| 4,492,620 | 1/1985 | Matsuo et al. | 204/192.12 |
| 4,525,262 | 6/1985 | Class et al. | 204/192.12 |
| 4,526,643 | 7/1985 | Okano et al. | 156/345 |
| 4,572,759 | 2/1986 | Benzing | 156/345 |
| 4,581,118 | 4/1986 | Class et al. | 204/298.16 |
| 4,588,490 | 5/1986 | Cuomo et al. | 204/298.06 |
| 4,609,428 | 9/1986 | Fujimura | 156/643 |
| 4,610,770 | 9/1986 | Saito et al. | 204/192.1 |
| 4,624,767 | 11/1986 | Obinata | 204/298.37 |
| 4,657,619 | 4/1987 | O'Donnell | 156/345 |
| 4,668,338 | 5/1987 | Maydan et al. | 156/643 |
| 4,738,761 | 4/1988 | Bobbio et al. | 204/192.12 |
| 4,778,561 | 10/1988 | Ghanbari | 156/643 |
| 4,842,683 | 6/1989 | Cheng et al. | 156/345 |
| 4,885,068 | 12/1989 | Uramoto et al. | 204/192.11 |

MAGNETRON METHOD AND APPARATUS FOR PRODUCING HIGH DENSITY IONIC GAS DISCHARGE

FIELD OF THE INVENTION

This invention relates to magnetrons for processing semiconductor or other substrates and more particularly to a method and apparatus for producing a high density ionic gas discharge in a magnetron.

BACKGROUND OF THE INVENTION

Plasma etching, deposition, and other processing techniques using a magnetron to contain the plasma above a substrate are well known to those having skill in the microelectronic device fabrication art. In a typical magnetron, magnetic confinement of a low pressure radio frequency (RF) ionic discharge is used to generate a high density plasma in order to expose a substrate to an ionic flux. As is well known to those having skill in the art, a magnetron may be employed to increase the ionic flux density, at a given plasma sheath voltage (defined below), to produce an anisotropic (directional) etch of a pattern into a substrate resulting in minimal undercutting and minimal unwanted enlargement of the etch pattern. The plasma sheath voltage is the electric potential that develops in the area between the substrate and the plasma. Electrons are largely excluded from this area due to the force exerted on the electrons by the electric field.

Magnetrons may also be used to deposit materials onto a substrate by exposing a material to be deposited to the high ionic flux. The substrate is placed outside of the region of intense flux such that the atoms and molecules ejected from the target material by the ionic flux, condense upon the substrate to be processed.

In order to efficiently process a substrate at a high rate without causing unwanted damage to the substrate, it is important that a high density plasma be developed, at low plasma sheath voltage. A high plasma density is necessary so that large numbers of ionic species can strike the substrate to process the substrate at an acceptable rate of production. Low sheath voltage is required so that the energy of the impinging ions is sufficiently low to restrict the effects of the impinging ions close to the substrate surface where material removal (etching) or build up (deposition) occurs. Higher energy ions impinge the surface and distribute excess energy to a greater depth in the substrate. This excess energy is ineffective for the etching or deposition processes and is undesirable since it results in the production of unwanted heat and substrate damage. Even in cases where the chemical activation energy for etching of the substrate being processed is typically less than one electron volt (eV), conventional etching devices must use energies on the order of many hundreds of eV in order to have sufficient ion current across the plasma sheath for useful etch rates. This higher ion energy produces unwanted heat and substrate damage.

The magnetron configuration attempts to obtain high ionic density at a low plasma sheath voltage by using a magnetic field to increase the density of electrons that cause ionizing collisions in the region above the substrate to be processed. In a typical magnetron, a magnetic field (B) is produced parallel to the substrate surface. This parallel magnetic field reduces the mobility of electrons to the surface of the substrate. An electric field (E) is produced perpendicular to the substrate surface (and therefore perpendicular to the magnetic field) by energizing a cathode below the substrate, thereby creating a plasma sheath. The combined effect of the E and B fields produces an electron drift velocity described by the cross product of the electric field and magnetic field vectors ($E \times B$). Accordingly, the region in which the electrons are confined, and therefore the ionic concentration is greatest, is known as the $E \times B$ drift region.

A remote plasma source or generator is desirable to increase plasma density in the $E \times B$ region, thereby increasing the processing rate. With a remote plasma source, the cathode requires a lower power input to create a large flux of ions to impinge the substrate surface. The cathode need only be biased to create an electric field perpendicular to the substrate surface in order to create an $E \times B$ electron drift region. The sheath voltage, and hence the electric field in the region, may be independently adjusted to produce the desired ion flux energy for a particular processing operation.

The art has attempted to couple remote sources to a substrate surface through various techniques. In U.S. Pat. No. 4,738,761, to Bobbio et al., and assigned to the assignee of the present invention, coupling of the plasma between the split cathode source and the substrate is accomplished through a continuous sheath voltage region. Therefore, the $E \times B$ electron drift velocity allows the electrons to move in a continuous closed path above the substrate surface and below the cathode surface, thereby creating a high density plasma in the region above the substrate.

In U.S. Pat. No. 4,588,490 to Cuoumo et al., the remote source penetrates the wall of the chamber and is disposed above and to one side of the magnetron target. The plasma stream emanating from the remote source is transported to the substrate surface across magnetic field lines.

Notwithstanding the above described attempts to improve magnetron performance, and in particular to improve coupling of remote plasma sources, present magnetrons are still limited as to the ionic flux density which can be achieved for a given energy imparted from the ionic flux to the substrate surface. Accordingly, high energy plasma must be used to achieve useful etch or deposition rates, thereby resulting in substrate damage and other unwanted effects, or slower processing rates must be tolerated to avoid substrate damage.

SUMMARY OF THE INVENTION

It is therefore an object of the present invention to provide a magnetron method and apparatus which produces a high plasma density gas discharge near the surface of a substrate.

It is another object of the invention to provide a magnetron method and apparatus for producing a high plasma density gas discharge near the substrate surface with low plasma sheath voltage to thereby reduce substrate damage and other unwanted effects while still providing processing rates that are suitable for practical use.

It is still another object of the invention to efficiently couple a plasma stream from a remote source to the $E \times B$ drift region in a magnetron.

These and other objects are provided according to the present invention by a method and apparatus for efficiently coupling a plasma stream from a remote plasma generator to the substrate surface in a magnetron having a magnetic field (B) parallel to the substrate surface and an electric field (E) perpendicular thereto, to produce an E×B electron drift region above the substrate surface. The remote plasma generator is located outside the E×B drift region and is oriented relative to the magnetic field, to transport the plasma stream into the E×B drift region parallel to the magnetic field with minimal movement of the plasma stream across magnetic field lines. A low cathode voltage may thereby be used to create an electric field perpendicular to the substrate and to extract the ions at low energy. Known cathodes, such as flat plate cathodes, hollow oval cathodes, or split cathodes may be used at low cathode voltages.

It has been found, according to the invention, that prior art magnetrons using remote sources, such as the Cuoumo et al. patent described above, were unable to achieve desired processing rates or extract ions at low energy because ionic flux density could not be increased without a corresponding increase in substrate damage. To couple the plasma stream from the source to the E×B drift region, the prior art required that the plasma from the remote source move across, or perpendicular to, the magnetic field lines. Such movement across magnetic field lines is inefficient due to its dependence on gas-phase scattering to couple the plasma stream to the E×B region.

The present invention overcomes these problems by transporting plasma from the remote source to the E×B drift region, substantially along magnetic field lines. For example, a uniform magnetic field may be generated parallel to the surface of the substrate with the E×B drift region also being above the surface and parallel thereto. The plasma generated by the remote source is transported to the E×B electron drift region above the surface of the substrate along the uniform parallel magnetic field lines.

In a preferred embodiment of the present invention, the magnetic field is provided by first and second permanent magnets of opposite polarity located at opposite ends of a substrate. The plasma stream generator is located remote from the substrate and positioned to provide a plasma stream parallel to the magnetic field and parallel to the surface of the substrate to be processed. An electron cyclotron resonance (ECR) source, a hollow cathode source, a radio frequency powered inductively coupled quartz tube plasma source, or other plasma source may be employed and may be positioned to provide a plasma stream parallel to the surface of the substrate.

The permanent magnets may be a pair of planar permanent magnets, perpendicular to the substrate surface and parallel to one another, at opposite ends of the substrate surface, to thereby provide a magnetic field of uniform intensity over the substrate and parallel thereto. The plasma stream source may be located inside the pair of permanent magnets and oriented to generate a plasma stream over the substrate and parallel to the magnetic field. Multiple sources may be used to provide a more uniform and higher density plasma above the substrate surface. In addition, each of the multiple sources may be coupled to a separate reactive gas source and the input energy of each source may be independently controlled. Therefore, the chemical makeup of the reactive ionic discharge and the discharge energy from each source may be customized, along with the reactive gas fed into the chamber, for a particular application. The use of multiple source and independent control of process gases and energy may permit the processing of substrates having substantially greater surface area than substrates that current magnetrons can efficiently and uniformly process.

The plasma stream sources may also be located outside the planar magnets in which case at least one of the planar magnets may include a passageway, such as a slot, to allow passage of the plasma stream from the source located outside the pair of permanent magnets to the substrate parallel to the magnetic field direction. The slot and magnet may be configured to provide a uniform magnetic field at the substrate surface. Electromagnets or permanent magnets may be used to shape the plasma stream prior to its entering the slot in the planar magnet.

According to the invention, a high density plasma at low plasma sheath voltage may created in the E×B region by the efficient coupling of a remote plasma source along, rather than across, magnetic field lines. The substrate may then be processed with minimal substrate damage and at a useful processing rate.

DESCRIPTION OF THE PREFERRED EMBODIMENT

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
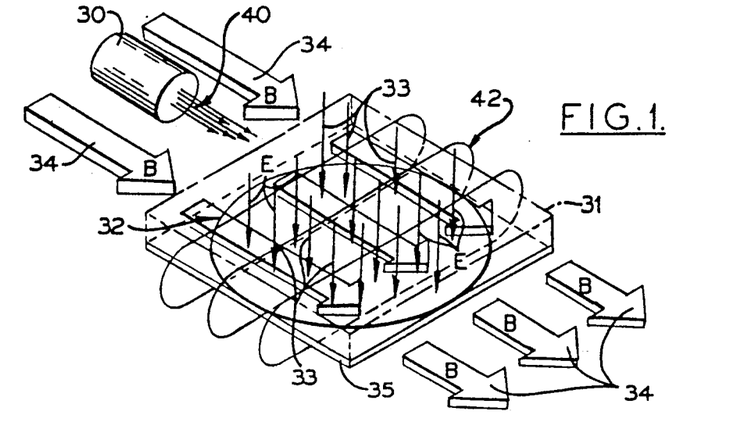
FIG. 1 is a simplified schematic diagram of the plasma coupling configuration of the present invention.

FIG. 1 is schematic illustration of the coupling configuration of the present invention. A remote plasma source, or sources 30, are disposed to generate the plasma stream 40 parallel with the magnetic field (B) lines 34 above the substrate 32 to be processed. The cathode 35, upon which the substrate 32 is disposed, is powered by a remote electrical energy source, not shown, to create an electric field (E) 33 perpendicular to the substrate surface 32 and to extract ions in a direction to impinge the substrate 32 causing the etching process to occur. As is well known to those skilled in the art, the cathode may be powered by electrical energy in a wide frequency range, for example, a range from direct current to thirty megahertz has been used in prior art magnetrons. The cathode 35 may function as a substrate holder, or a separate substrate holder, not shown, may be provided.

The magnetic field lines 34 and the electric field 33 created by the cathode 35 interact to create an $E \times B$ electron drift region 31 in the direction of the cross product of the electric and magnetic fields. The plasma 40 emitted by the source, or sources 30, is contained in the $E \times B$ region 31 while the electrons are confined in circulating patterns 42 above the substrate 32 and which may, in certain magnetron configurations, continue below the cathode 35. It will be understood to one skilled in the art to substitute a non-closed loop system for the closed loop electron circulating pattern 42 in order to reduce the mechanical complexity of the cathode connections and suspension system. It will also be understood by those having skill in the art that the $E \times B$ region 31 does not end abruptly as shown in FIG. 1, but rather the plasma density gradually decreases near the boundaries shown.

According to the invention, the remote source, or sources 30, are disposed to transport the plasma stream 40 into the $E \times B$ region 31 above the substrate 32 so that the plasma stream need not traverse across the magnetic field lines 34. The height of the $E \times B$ drift region 31 above the area of the substrate 32 is determined primarily by the strengths of the electric (E) 33 and magnetic fields (B) 34. The electric field (E) strength is a function of the voltage developed in the area between the substrate and the plasma wherein the electrons are largely excluded, also known as the plasma sheath voltage. For a typical sheath voltage used in reactive ion etching, between 10 and 200 volts, this $E \times B$ region 31 begins essentially at the surface of the substrate 32. For a typical magnetic field (B) 34 of two hundred gauss, this region extends upwards for a distance of about 4 millimeters above the substrate 32. The remote source 30 is preferably disposed such that the maximum quantity of the disgorged plasma intersects the $E \times B$ drift region 31. It is understood that one skilled in the art could vary the emitting aperture of the remote source, or sources 30, or employ a plasma stream shaping means, such as permanent magnets or electromagnets, to further concentrate the plasma stream to provide greater coupling of the plasma stream into the $E \times B$ drift region 31.

The use of a remote source 30 in the present invention allows a lower power to be applied to the cathode 35 compared to heretofore available magnetrons. This lowering of the cathode power consequently reduces unwanted heat and damage to the substrate 32. Transporting the plasma stream 40 into a parallel magnetic field 34 above the substrate 32 results in greater coupling efficiency of the source to the $E \times B$ region 31. The greater coupling efficiency yields a higher plasma density above the substrate surface 32, allowing for greater throughput for the processing operation. Because the plasma stream 40 is transported into a parallel magnetic field (B) 34 according to the invention, the source need not be placed so close to the edge of the substrate so as to become a physical or electrical barrier to the $E \times B$ drift region 31, nor need the source be placed such that its plasma stream must cross perpendicular to magnetic field lines 34 as in previous magnetron designs.

Figure 2:
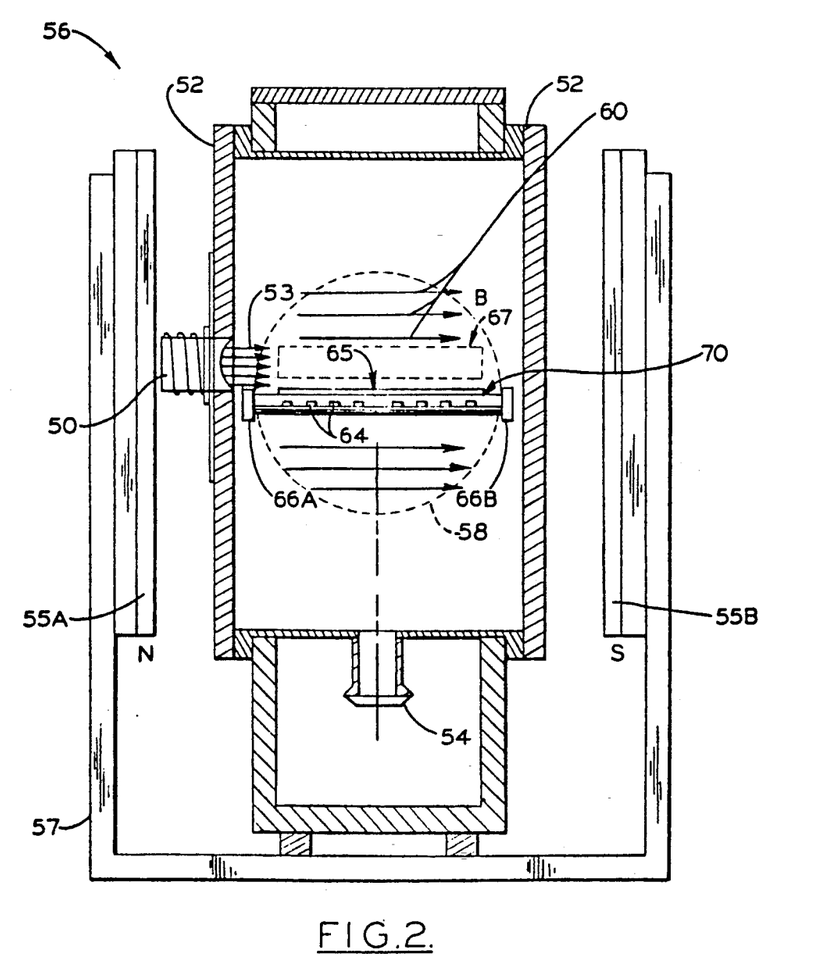
FIG. 2 is a side perspective view of a first embodiment of a magnetron discharge processing apparatus of the present invention, including multiple quartz tube remote plasma sources disposed within planar magnets.

FIG. 2 is a side perspective view of a first embodiment of a magnetron discharge processing apparatus 56 according to the present invention. One or more remote plasma sources 50 are disposed between the planar magnets 55A, 55B to disgorge plasma 53 into the $E \times B$ drift region 67 along magnetic field lines 60 parallel to the substrate surface 65. A conventional gas tight evacuable chamber 52 is shown disposed within a mounting support and flux return 57 for the permanent planar magnets 55A, 55B. The flux return confines and intensifies the magnetic field between planar magnets 55A and 55B. The chamber 52 may also contain one or more viewing or diagnostic ports 54 and an access hatch 58. A cathode 70, with external radio frequency connections not shown, is disposed within the chamber 52 and may be secured by mounting on insulating frames 66A, 66B attached to the chamber 52 side walls. It would be known to one skilled in the art to substitute conductive non-magnetic "wings" energized at the cathode potential and extending above the surface of the substrate 65 in place of the insulating frames 66A, 66B for further electrostatic confinement of the plasma stream in the $E \times B$ region 67 above the surface of the substrate 65. It would also be known to one skilled in the art to create an opening in the wing 66A nearest the source to allow the plasma to flow into the $E \times B$ region 67. The action of the "wings" and their use in plasma confinement is more fully described in J. Thornton and A. Penfold, Chapter 2 "Cylindrical Magnetron Sputtering" of F. Vossen and W. Kern, "Thin Film Processes," Academic Press (1978) the disclosure of which is hereby incorporated herein by reference.

A semiconductor wafer 65 or other substrate to be processed is supported by or rests upon the top of the cathode assembly 70. The cathode 70 may have a top surface which includes one or more recesses, to hold one or more substrates 65 thereon. A flat top cathode surface may also function as a substrate holder. A discrete substrate holder, separate from the cathode, may also be provided. For additional substrate and cathode cooling, the cathode 70 may contain circuitous cooling channels 64 for the circulation of a cooling fluid.

Figure 3A:
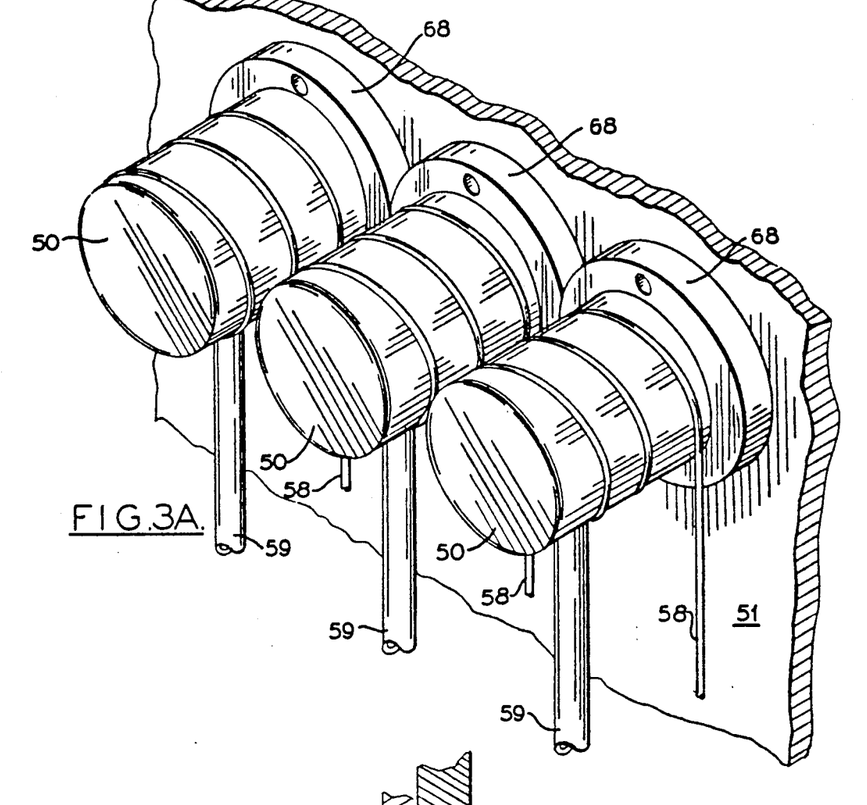
FIG. 3A is a side perspective view of a section of the apparatus of FIG. 2.
Figure 3B:
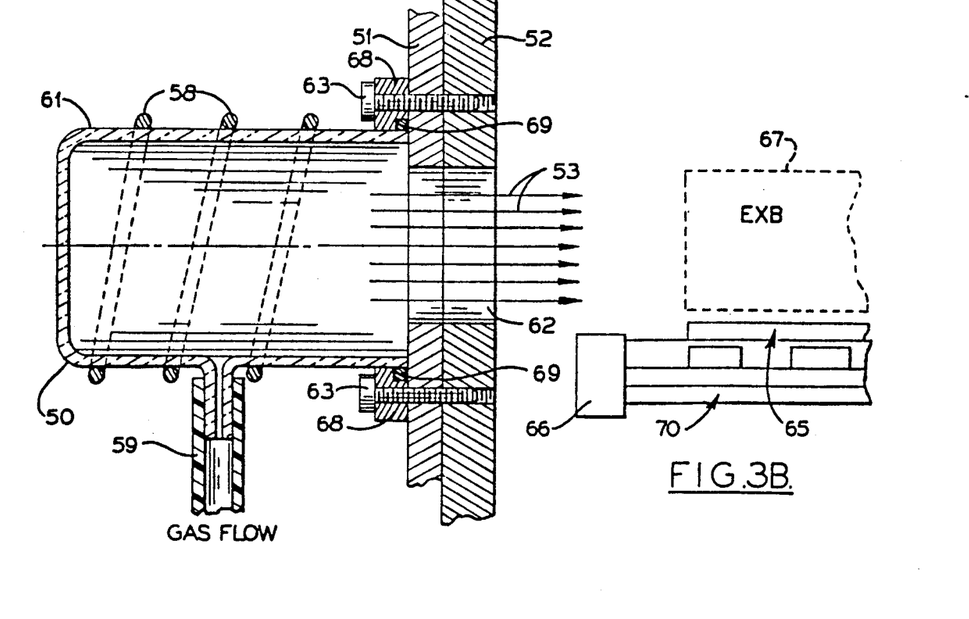
FIG. 3B is a detailed view of a single remote quartz tube source of FIG. 3A including its mounting arrangement.

Referring to FIGS. 3A and 3B, an assembly of remote plasma sources, in this embodiment three quartz tube plasma sources 50, are mounted on the large side flange 51 of a wall of the chamber 52. The quartz tube source is an inexpensive source that also yields a high plasma density. The quartz tube source is more fully described in R. W. Boswell, A. J. Perry, and M. Emami, "Multipole Confined Diffusion Plasma Produced by 13.56 MHz Electrodeless Source," *Journal of Vacuum Science Technology*, Vol. 7, No. 6, pp. 3345-3350, November/December 1989 the disclosure of which is hereby incorporated herein by reference. Each quartz tube source 50 is physically mounted to the side flange 51 by the use of a compression flange 68 in conjunction with a sealing "O" ring 69 to ensure integrity of the evacuable chamber. The compression flange 68 is secured to the side flange 51 by screws 63 or other suitable securing means.

Radio frequency energy from a source, not shown, is fed to the individual plasma sources 50 through inductive couplings 58 surrounding the quartz tubes 61 of the sources. The reactive gas is fed through tubing 59 to the quartz tube 61 of the source 50. The RF energy in combination with the reactive gas produces a stream of plasma 53 which disgorges through the opening 62 in the side flange 51. It will be understood by those having skill in the art that each plasma source may be individually controlled as to the RF energy and the reactive gas parameters, including the chemical makeup and flow rate of the gases. Alternatively, groups of sources may be controlled together or all of the sources may be controlled as a unit. Substrate processing flexibility is thereby provided.

Referring to FIGS. 2 and 3B, the sources 50 are positioned to disgorge their plasma stream 53 through the chamber wall opening 62 and into the $E \times B$ electron drift region 67 above the wafer surface 65. For a typical plasma sheath voltage and magnetic field strength used in reactive ion etching, for example 100 volts and 200 gauss respectively, this $E \times B$ region 67 begins at about the top surface of the substrate 65 and extends vertically for a distance of about 4 millimeters above the top surface of the substrate 65. Coupling of the source 50 to the $E \times B$ region is enhanced if the source 50 is vertically aligned to provide maximum overlap of the disgorging plasma stream 53 with the $E \times B$ region 67 height. It is readily apparent for one skilled in the art to use a single or multiple remote sources. In addition, it would also be apparent to one skilled in the art to substitute an electron cyclotron resonance source, such as disclosed in U.S. Pat. No. 4,778,561 to Ghanbari, or a hollow cathode source as described in U.S. Pat. No. 4,588,490 to Cuomo et al., (the disclosures of which are hereby incorporated herein by reference) or other plasma source in place of the quartz tube sources shown in the FIGS. 2, 3A and 3B.

Figure 4:
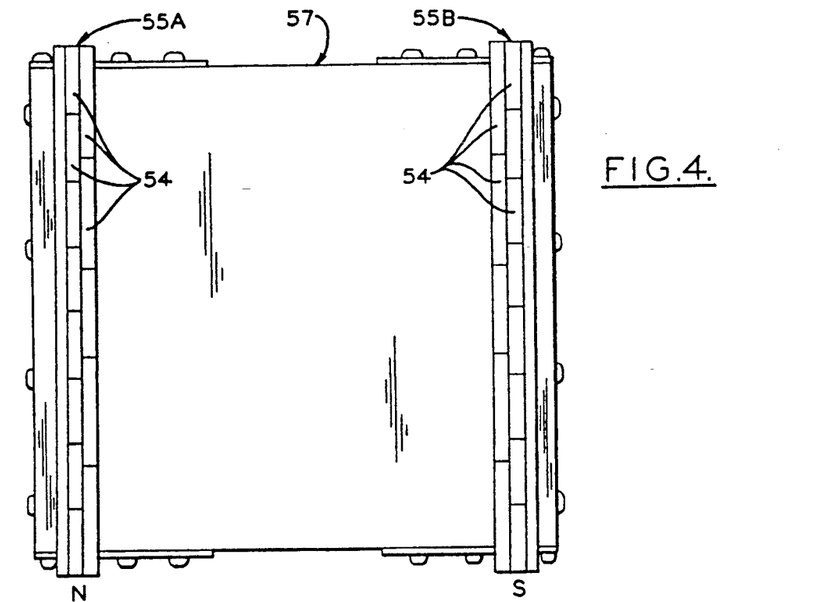
FIG. 4 is a top view of the planar magnet construction of FIG. 2.

Referring to FIGS. 2 and 4, planar magnets 55A, 55B are disposed within a mounting support and magnetic flux return 57 on either side of the evacuable chamber 52 to provide a North pole at one side of the chamber and a South pole at the opposing side of the chamber. The construction of the planar magnets 55A, 55B includes a brick construction arrangement of individual alnico magnet blocks 54. Permanent magnets are illustrated in the preferred embodiment because they are capable of generating a sufficiently uniform and high strength magnetic field (for example, 200 gauss) over the substrate surface 65. It would be readily apparent for one skilled in the art to substitute electromagnets, also referred to as Helmhotz coils, for the permanent planar magnets. Known commercially available electromagnets typically contain an air core in order to produce a uniform field and, therefore, produce a lower field strength (for example, 60 gauss) above the substrate 65.

Figure 5:
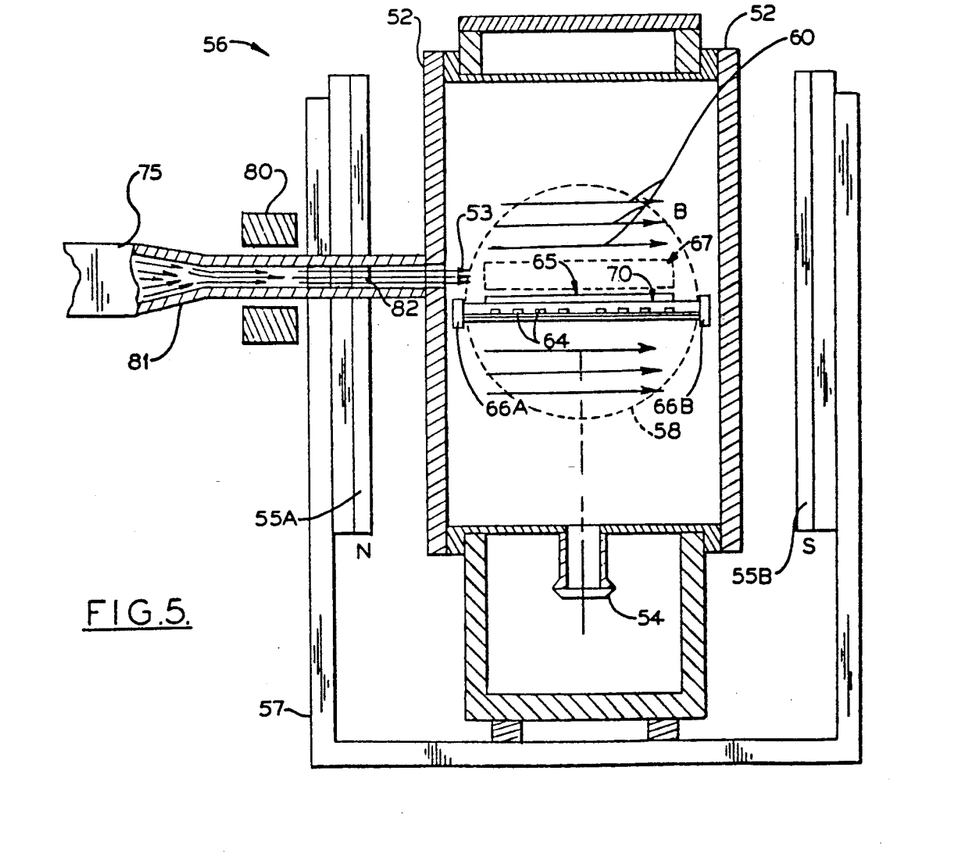
FIG. 5 is a side perspective view of an alternate embodiment of the present invention with the remote source disposed outside the planar magnets.

An alternative embodiment of the present invention is shown in FIG. 5. This embodiment includes a remote ECR source 75 external to the planar magnet 55 coupled to the evacuable chamber 52 by a tube 81 or other evacuable passageway. It would be known to one skilled in the art to substitute alternative sources for the ECR source. Such a source may be a hollow cathode plasma generator, a quartz tube source, or another type of plasma source. It would also be known to one skilled in the art to use single or multiple sources to attain the desired plasma density over the substrate surface 65 using single or multiple passageways. An opening or slot 82 is positioned in the planar magnet 55 to allow the plasma stream 53 to travel from the remote source 75 to the substrate surface 65 along a path parallel to the magnetic field lines 60. Stream shaping means 80 may be disposed between the remote source 75 and the planar magnet 55 to shape the plasma stream 53 for maximum coupling to the substrate surface 65. Such shaping means 80 may be either in the form of permanent magnets or electromagnets as would be readily apparent to on skilled in the art.

Figure 6:
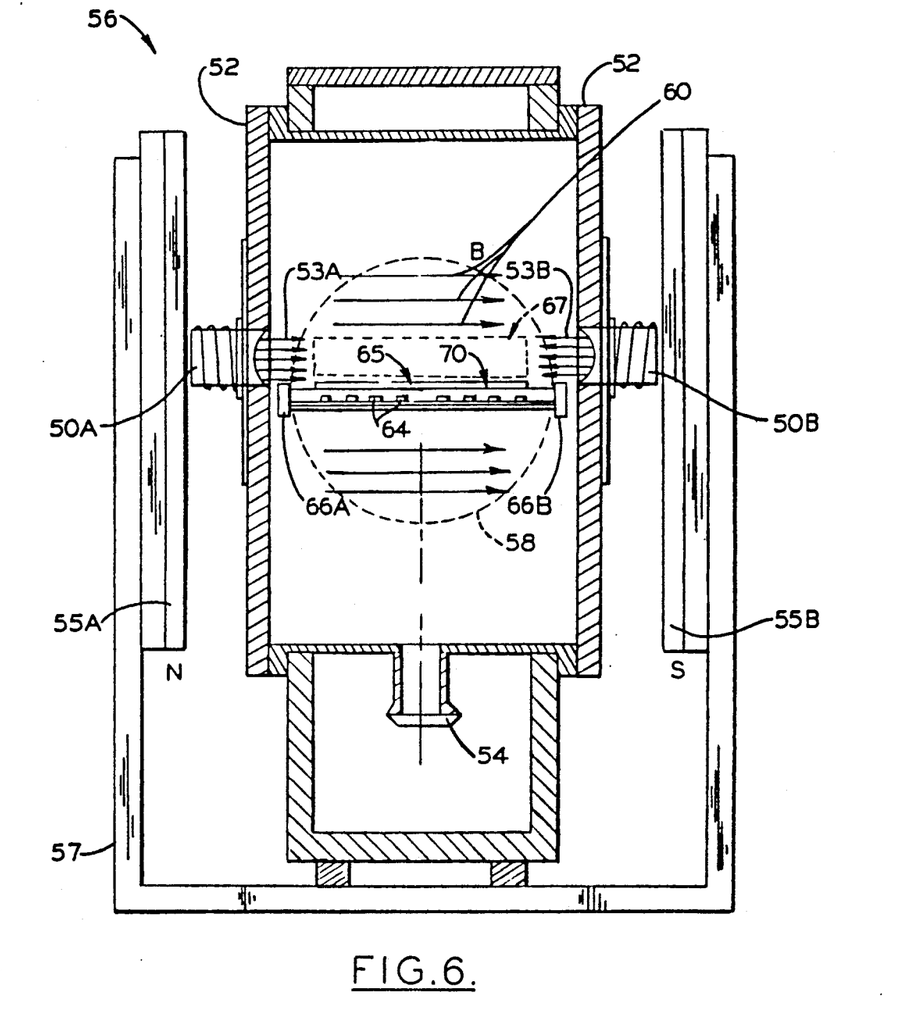
FIG. 6 is a side perspective view of another embodiment of a magnetron discharge processing apparatus of the present invention, including multiple remote sources located on opposite ends of an evacuable chamber.

Another alternative embodiment of the present invention is shown in FIG. 6. This embodiment includes remote quartz tube plasma sources 50A, 50B coupled to both opposing walls of the evacuable chamber 52. The plasma discharge 53A is coupled to the substrate surface 65 from the source located nearer the planar magnet 55A and in the same direction as the magnetic field lines 60. Similarly, the plasma discharge 53B from the source 50B nearer the planar magnet 55B is coupled along the magnetic field lines 60, but in the opposite direction from the magnetic field lines 60.

Figure 7:
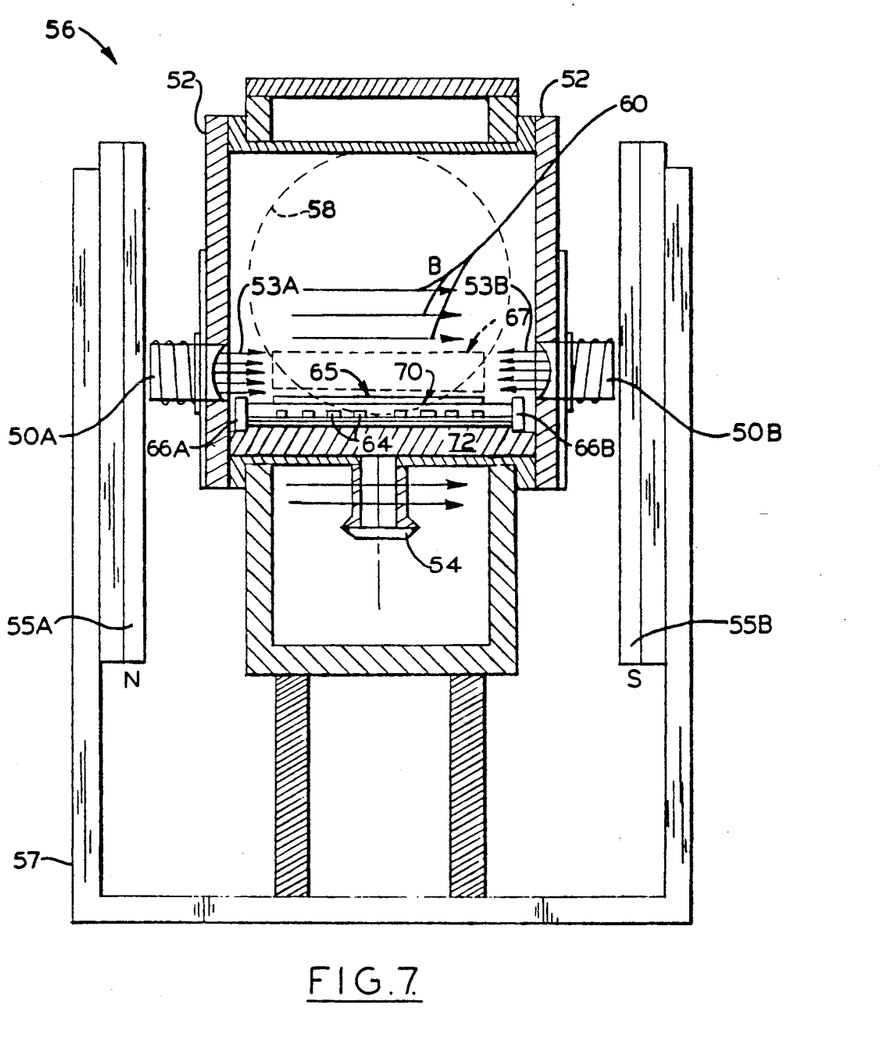
FIG. 7 is a side perspective view of another embodiment of a magnetron discharge processing apparatus of the present invention, including a cathode assembly disposed near the bottom of an evacuable chamber.

FIG. 7 illustrates another alternative embodiment of the present invention wherein the cathode 70 is supported on an insulator 72 resting upon the bottom of the evacuable chamber 52. This embodiment is a mechanically simpler system to implement, not requiring suspension of the cathode 70 and substrate 65, than a system allowing the electron current loops to continue below the cathode surface as illustrated by the electron paths 42 in FIG. 1. Cooling fluid connections, electrical power connection to the cathode, and automated substrate manipulation mechanisms are simplified by positioning the substrate 65 near the bottom of the evacuable chamber 52.

Figure 8:
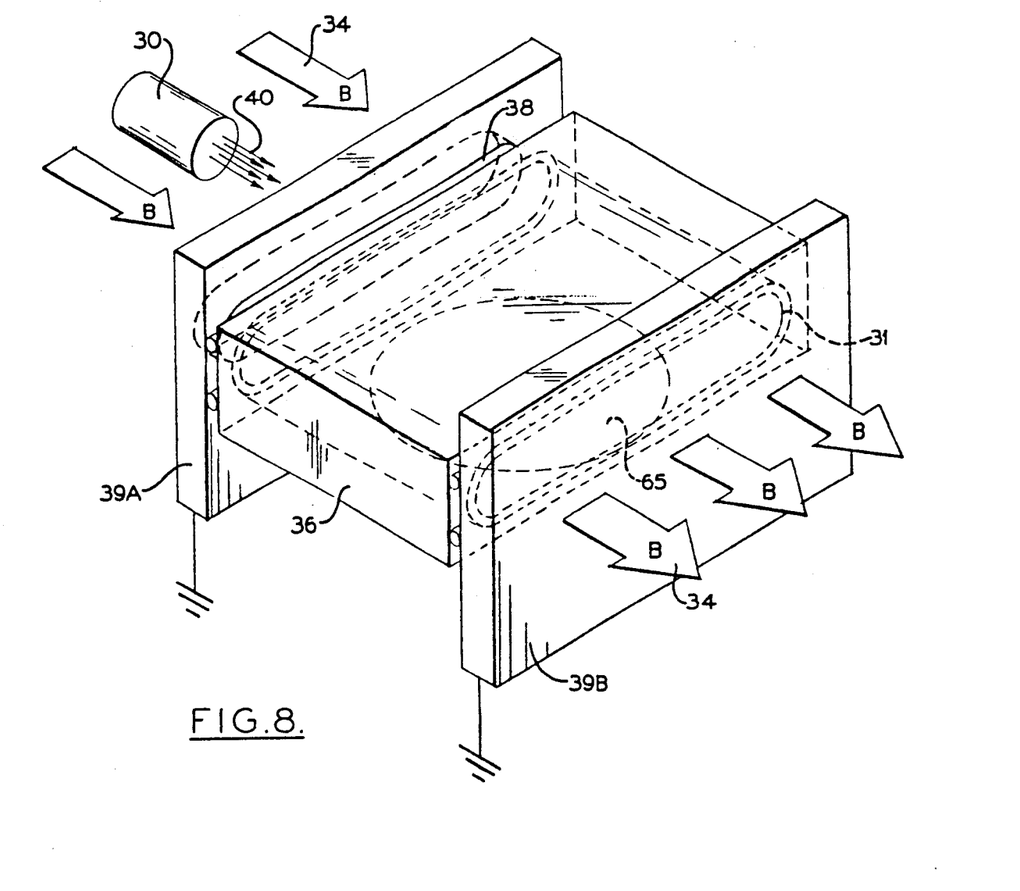
FIG. 8 is a simplified schematic diagram of the coupling scheme of the present invention used in an oval cross-section hollow cathode magnetron configuration.

FIG. 8 illustrates an embodiment of the present invention adapted to the hollow oval magnetron structure of the type described in Lin I and Ming-Shing Wu, "Hollow Oval Magnetron for Large-Area Low-Energy Ions," *Journal of Applied Physics*, vol. 60, No. 6, Sept. 15, 1986, the disclosure of which is hereby incorporated herein by reference. The device consists of a main hollow cathode 36 with an oval cross-section inner surface and two grounded electrodes 39A, 39B disposed at either end, and insulated from, the main hollow cathode 36. A passageway 38 is made in the grounded electrode 39A nearer the remote plasma source 30 to allow the plasma stream 40 to travel along the parallel magnetic field lines 34 to the $E \times B$ region within the body of the main cathode 36. Due to the configuration of the device, the $E \times B$ region 31 forms in a loop conformal to the inner surface of the hollow cathode 36. The substrate 65 to be processed may be placed on the lower inner surface of the main hollow cathode 36.

As described above, the invention may be used for reactive ion etching (RIE). However, it will be understood by those skilled in the art that the invention may be used for processing substrates by sputter deposition, by plasma enhanced chemical vapor deposition (PECVD), or by other substrate processing operations. In sputter deposition, the target material, for example aluminum, is positioned in place of the substrate thereby being exposed to the high density ionic flux. Atoms or molecules driven from the target deposit on the surface of a substrate or substrates positioned outside the region of high ionic flux within the evacuable chamber. For PECVD, the reactive gases used in RIE are substituted with deposition gases, such as dichlorosilane (SiH$_2$Cl$_2$), silane (SiH$_4$), or tetraethylorthosilicate (TEOS).

Many modifications and other embodiments of the invention will come to one skilled in the art having the benefit of the teachings presented in the foregoing descriptions and the associated drawings. Therefore, it is to be understood that the invention is not to be limited to the specific embodiment disclosed, and that modifications and embodiments are intended to be included within the scope of the appended claims.

That which is claimed is:

1. A magnetron gas discharge processing apparatus for processing a surface of a substrate, comprising:

an evacuable chamber for containing a reactant gas therein;

means for generating a magnetic field (B) in said chamber across the substrate surface;

means for generating an electric field (E) in said chamber perpendicular to the substrate surface; and means for generating a plasma stream in said chamber, the plasma stream interacting with said magnetic field and said electric field to create an E×B electron drift region adjacent to the substrate surface, said E×B region beginning substantially at the substrate surface and extending outwardly a predetermined distance therefrom:

said plasma generating means being located outside said E×B region, said plasma generating means and said magnetic field generating means being oriented to transport said plasma stream from said plasma stream generating means to enter laterally into said E×B region between the substrate surface and said predetermined distance therefrom parallel to said magnetic field with minimal movement of said plasma stream perpendicular to said magnetic field in travelling from said plasma generating means to said E×B region;

whereby a high density plasma stream is transported to said E×B region, to provide high density magnetron gas discharge processing of the substrate.

2. The magnetron gas discharge processing apparatus of claim 1 wherein said magnetic field generating means comprises a first magnetic pole at one end of the substrate surface, and a second magnetic pole of opposite polarity from said first magnetic pole, at an end of the substrate surface opposite said one end.

3. The magnetron gas discharge processing apparatus of claim 2 wherein said first and second magnetic poles comprise a first and second array of permanent magnets respectively, the first array being oriented to provide the first magnetic pole, and the second array being oriented to provide the second magnetic pole of opposite polarity from said first magnetic pole.

4. The magnetron gas discharge processing means of claim 3 wherein said magnetic field generating means further comprises a flux return between said first and second array of permanent magnets.

5. The magnetron gas discharge processing apparatus of claim 2 wherein said plasma generating means is located between said first and second magnetic poles.

6. The magnetron gas discharge processing apparatus of claim 2 wherein said plasma generating means is located outside said first and second magnetic poles.

7. The magnetron gas discharge processing apparatus of claim 2 wherein said plasma generating means is located on one of said first and second magnetic poles.

8. The magnetron gas discharge processing means claim 1 wherein said magnetic field generating means comprises an electromagnet.

9. The magnetron gas discharge processing apparatus of claim 1 wherein said plasma stream generating means comprises an electron cyclotron resonance plasma source.

10. The magnetron gas discharge processing apparatus of claim 1 wherein said plasma stream generating means comprises a hollow cathode plasma source.

11. The magnetron gas discharge processing apparatus of claim 1 wherein said plasma stream generating means comprises a radio frequency powered inductively coupled quartz tube plasma source.

12. The magnetron gas discharge processing apparatus of claim 1 wherein said electric field generating means comprises a cathode.

13. The magnetron gas discharge processing apparatus of claim 12 wherein said cathode comprises a flat plate cathode.

14. The magnetron gas discharge processing apparatus of claim 12 wherein said cathode comprises a flat plate cathode including a first and second electrically conductive non-magnetic endpiece extending above the substrate surface;

said first endpiece being disposed at one end of said flat plate cathode between said remote plasma stream generating means and the substrate surface, said first endpiece including an opening therein, said opening and said plasma stream generating means being oriented to transport said plasma stream through said opening into said E×B drift region between the substrate surface and said predetermined distance therefrom; and said second endpiece being disposed at an end of said flat plate cathode opposite said one end;

whereby electrostatic confinement of said plasma stream in said E×B region is enhanced.

15. The magnetron gas discharge processing apparatus of claim 12 wherein said cathode comprises a hollow oval cylinder.

16. The magnetron gas discharge processing apparatus of claim 12 wherein said cathode includes means for holding the substrate.

17. The magnetron gas discharge processing apparatus of claim 1 further comprising means for holding the substrate in s id evacuable chamber.

18. The magnetron gas discharge processing apparatus of claim 1 wherein said plasma stream generating means generates a plasma stream parallel to said magnetic field and in the same direction as said magnetic field.

19. The magnetron gas discharge processing apparatus of claim 1 wherein said plasma stream generating means generates a plasma stream parallel to said magnetic field and in the opposite direction as said magnetic field.

20. The magnetron gas discharge processing apparatus of claim 1 wherein said plasma stream generating means comprises a plurality of plasma stream generators.

21. The magnetron gas discharge processing apparatus of claim 20 wherein each of said plurality of plasma generators includes means for controlling the energy of the generated plasma stream, and means for controlling the type of plasma in the generated plasma stream, whereby a plurality of plasma streams may be independently controlled.

22. The magnetron gas discharge processing apparatus of claim 20 wherein at least one of said plurality of plasma stream generators generates a plasma stream parallel to said magnetic field and in the same direction as said magnetic field.

23. The magnetron gas discharge processing apparatus of claim 20 wherein at least one of said plurality of plasma stream generators generates a plasma stream parallel to said magnetic field and in the opposite direction as said magnetic field.

24. The magnetron gas discharge processing apparatus of claim 1 wherein said electric field generating means produces a plasma sheath voltage of about 100 volts, wherein said magnetic field generating means produces a magnetic field of about 200 gauss adjacent the substrate surface, and wherein said plasma stream generating means and said magnetic field generating means are oriented to transport said plasma stream into the E×B region adjacent the substrate surface beginning substantially at the substrate surface and extending outwardly about 4 millimeters therefrom.

25. A magnetron gas discharge processing apparatus for processing a surface of a substrate, comprising:
an evacuable chamber for containing a reactant gas therein;
first and second permanent magnets, a respective one of which is located at opposite ends of the substrate surface, for generating a magnetic field (B) in said chamber across the substrate surface and parallel thereto, said first magnet including a passageway therein;
means for generating an electric field (E) in said chamber perpendicular to the substrate surface; and
means for generating a plasma stream outside said first and second permanent magnets and adjacent said first permanent magnet, said plasma stream entering said magnetic field through said passageway, said plasma stream interacting with said magnetic and salt electric fields to create an E×B electron drift region adjacent to the substrate surface, said E×B region beginning substantially at the substrate surface and extending outwardly a predetermined distance therefrom;
said plasma generating means and said passageway being oriented to transport said plasma stream through said passageway into said magnetic field and to enter laterally into said E×B region between the substrate surface and said predetermined distance therefrom parallel to said magnetic field with minimal movement of said plasma stream perpendicular to said magnetic field in travelling from said plasma generating means to said E×B region;
whereby a high density plasma stream is transported to said E×B region, to provide high density magnetron gas discharge processing of the substrate.

26. The magnetron gas discharge processing apparatus of claim 25 wherein said passageway comprises a slot parallel to the substrate surface.

27. The magnetron gas discharge processing apparatus of claim 26 further comprising plasma stream flattening means, located between said plasma stream source and said slot, for flattening said plasma stream to concentrate said plasma stream through said slot.

28. The magnetron gas discharge processing apparatus of claim 27 wherein said flattening means comprises a pair of opposing solenoids, located above and below said slot, respectively.

29. The magnetron gas discharge processing apparatus of claim 25 wherein said first and second permanent magnets comprises first and second planar permanent magnets, each mounted perpendicular to the substrate surface and parallel to one another.

30. The magnetron gas discharge processing apparatus of claim 25 wherein said first and second permanent magnets comprise a first and second array of permanent magnets respectively, the first array being oriented to provide a first magnetic pole, and the second array being oriented to provide a second magnetic pole of opposite polarity from said first magnetic pole.

31. The magnetron gas discharge processing apparatus of claim 30 further comprising a flux return between said first and second array of permanent magnets.

32. The magnetron gas discharge processing apparatus of claim 25 wherein said plasma stream generating means comprises an electron cyclotron resonance plasma source.

33. The magnetron gas discharge processing apparatus of claim 25 wherein said plasma stream generating means comprises a hollow cathode plasma source.

34. The magnetron gas discharge processing apparatus of claim 25 wherein said plasma stream generating means comprises a radio frequency powered inductively coupled quartz tube plasma source.

35. The magnetron gas discharge processing apparatus of claim 25 further comprising plasma stream shaping means, located between said plasma stream source and said passageway, for directing said plasma stream through said passageway.

36. The magnetron gas discharge processing apparatus of claim 25 wherein said electric field generating means comprises a cathode.

37. The magnetron gas discharge processing apparatus of claim 35 wherein said cathode comprises a flat plate cathode.

38. The magnetron gas discharge processing apparatus of claim 36 wherein said cathode comprises a flat plate cathode including a first and second electrically conductive non-magnetic endpiece extending above the substrate surface;
said first endpiece being disposed at one end of said flat plate cathode between said remote plasma stream generating means and the substrate surface, said first endpiece including an opening therein, said opening and said plasma stream generating means being oriented to transport said plasma stream through said opening into said E×B drift region between the substrate surface and said predetermined distance therefrom; and
said second endpiece being disposed at an end of said flat plate cathode opposite said one end;
whereby electrostatic confinement of said plasma stream in said E×B region is enhanced.

39. The magnetron gas discharge processing apparatus of claim 36 wherein said cathode comprises a hollow oval cylinder.

40. The magnetron gas discharge processing apparatus of claim 36 wherein said cathode includes means for holding the substrate.

41. The magnetron gas discharge processing apparatus of claim 25 further comprising means for holding the substrate in said evacuable chamber 42. The magnetron gas discharge processing apparatus of claim 25 wherein said plasma stream generating means generates a plasma stream parallel to said magnetic field and in the same direction as said magnetic field.

43. The magnetron gas discharge processing apparatus of claim 25 wherein said plasma stream generating means generates a plasma stream parallel to said magnetic field and in the opposite direction as said magnetic field.

44. The magnetron gas discharge processing apparatus of claim 25 wherein said plasma stream generating means comprises a plurality of plasma stream generators.

45. The magnetron gas discharge processing apparatus of claim 44 wherein each of said plurality of plasma generators includes means for controlling the energy of the generated plasma streams, and means for controlling the type of plasma in the generated plasma stream, whereby a plurality of plasma streams may be independently controlled.

46. The magnetron gas discharge processing apparatus of claim 25 wherein said plasma generating means is mounted on said first magnet over said passageway.

47. The magnetron gas discharge processing apparatus of claim 25 wherein said electric field generating means produces a plasma sheath voltage of about 100 volts, wherein said first and second permanent magnets produce a magnetic field of about 200 gauss adjacent the substrate surface, wherein said passageway has a height with respect to the substrate surface of about 4 millimeters, and wherein said plasma stream generating means and said passageway are oriented to transport said plasma stream into the E×B region adjacent the substrate surface beginning substantially at the substrate surface and extending outwardly about 4 millimeters therefrom.

48. A method for generating a high density ionic gas discharge for processing a surface of a substrate, comprising the steps of:
generating a magnetic field (B) across the substrate surface;
generating an electric field (E) perpendicular to the substrate surface;
generating a plasma stream; and
transporting the generated plasma stream adjacent to the substrate surface, to create an E×B electron drift region adjacent to a substrate surface beginning substantially at the substrate surface and extending outwardly a predetermined distance therefrom;
said transporting step further comprising the step of transporting the generated plasma stream to enter laterally into the E×B region between the substrate surface and the predetermined distance therefrom parallel to the generated magnetic field with minimal movement of the plasma stream perpendicular to the generated magnetic field in travelling from the plasma generator to the E×B region.

49. The method of claim 48 wherein said transporting step further comprises the step of transporting the generated plasma stream to the E×B region parallel to and in the same direction as the generated magnetic field.

50. The method of claim 48 wherein said transporting step further comprises the step of transporting the generated plasma stream to the E×B region parallel to and in the opposite direction as the generated magnetic field.

51. The method of claim 48 wherein said generating step further comprises the step of generating a plurality of plasma streams, and wherein said transporting step comprises the step of transporting the plurality of plasma streams.

52. The method of claim 48 wherein said step of generating a magnetic field comprises the step of generating a magnetic field of about 200 gauss adjacent the substrate surface, wherein said step of generating an electric field comprises the step of generating a plasma sheath voltage of about 100 volts, and wherein said step of transporting the generated plasma stream into the E×B region comprises the step of transporting the plasma stream into the E×B region beginning substantially at the surface of the substrate and extending outwardly about 4 millimeters therefrom.

* * * * *